United States Patent
Lee

(10) Patent No.: US 8,143,931 B2
(45) Date of Patent: Mar. 27, 2012

(54) FLAG SIGNAL GENERATION CIRCUIT AND SEMICONDUCTOR DEVICE HAVING THE SAME

(75) Inventor: Seong Seop Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/844,307

(22) Filed: Jul. 27, 2010

(65) Prior Publication Data

US 2011/0050311 A1    Mar. 3, 2011

(30) Foreign Application Priority Data

Aug. 28, 2009    (KR) .................. 10-2009-0080737

(51) Int. Cl.
*H03K 3/00*    (2006.01)

(52) U.S. Cl. ......... 327/291; 327/298; 327/512; 365/211
(58) Field of Classification Search .................. None
See application file for complete search history.

(56) References Cited

U.S. PATENT DOCUMENTS

| | | | |
|---|---|---|---|
| 7,369,451 B2 * | 5/2008 | Oh | 365/222 |
| 7,560,978 B2 * | 7/2009 | Byeon et al. | 327/536 |
| 7,911,868 B2 * | 3/2011 | Lee | 365/222 |
| 2010/0142304 A1 | 6/2010 | Pyeon | |

FOREIGN PATENT DOCUMENTS

| | | |
|---|---|---|
| KR | 1020080029299 A | 4/2008 |
| KR | 1020080063520 A | 7/2008 |
| KR | 100854463 B1 | 8/2008 |

* cited by examiner

*Primary Examiner* — An Luu
(74) *Attorney, Agent, or Firm* — William Park & Associates Ltd.

(57) ABSTRACT

A flag signal generation circuit includes a first periodic signal detection unit, a second periodic signal detection unit, and a flag signal output unit. The first periodic signal detection unit is configured to detect a change in a level of a first periodic signal and generate a first detection signal. The second periodic signal detection unit is configured to detect a change in a level of a second periodic signal and generate a second detection signal. The flag signal output unit is configured to generate a pre-flag signal from the first and second detection signals, buffer the pre-flag signal in response to a mode register read signal, and output the buffered pre-flag signal as a flag signal.

25 Claims, 3 Drawing Sheets

FLAG SIGNAL GENERATION CIRCUIT AND SEMICONDUCTOR DEVICE HAVING THE SAME

CROSS-REFERENCES TO RELATED APPLICATIONS

The present application claims priority under 35 U.S.C. 119(a) to Korean application number 10-2009-0080737, filed on Aug. 28, 2009, in the Korean intellectual property Office, which is incorporated herein by reference in its entirety set forth in full.

BACKGROUND

In general, a register set is used to define the operation modes of a semiconductor device, and it is provided with a mode register set (MRS) and an extended mode register set (EMRS). The MRS and the EMRS set the operation modes of a semiconductor device based on the values applied to the address pins with a mode register set command. Information about the set operation modes is substantially maintained until a semiconductor device is reprogrammed or its power is interrupted. The MRS is necessary for synchronous dynamic random access memories (SDRAM) or static random access memories (SRAM). Before a semiconductor device is in use, the MRS sets the operation modes of the semiconductor device such as burst length (BL), column address strobe (CAS), signal latency (CL), and read latency (RL).

Meanwhile, the semiconductor devices used in mobile devices, such as portable computers, PDAs, hand-held phones, and so on (hereinafter, referred to as "mobile memory chips") are required to reduce power consumption to improve the portability of the mobile devices having such mobile memory chips therein. The mobile memory chips are also required to improve the data transfer rate to increase the operating speeds of mobile devices having such memory chips therein. To meet these demands, a low power DDR2 (LPDDR2) technology was developed to dramatically improve both the power consumption and the data transfer rate. The LPDDR2 technology can implement the data transfer rate of 800 Mbps, which is currently the highest in the industry, at an operating voltage of 1.2 V. Furthermore, since an ultra-fine 66-nano process is applied to the LPDDR2 technology, a mobile memory chip can be packaged to a size of 9 mm×12 mm.

According to the LPDDR2 technology specification, the specification defines an MRS to set a signal for the information on the internal temperature change of a semiconductor device and to store the information in a register.

SUMMARY

An embodiment of the present invention relates to a flag signal generation circuit capable of extracting a flag signal, which includes information about a change in the internal temperature of a semiconductor device, from information about a self-refresh period differently set depending on the change in the internal temperature, and a semiconductor device including the same.

In one embodiment, a flag signal generation circuit includes: a first periodic signal detection unit configured to detect a change in a level of a first periodic signal and generate a first detection signal; a second periodic signal detection unit configured to detect a change in a level of a second periodic signal and generate a second detection signal; and a flag signal output unit configured to generate a pre-flag signal from the first and second detection signals, buffer the pre-flag signal in response to a mode register read signal, and output the buffered pre-flag signal as a flag signal.

In another embodiment, a semiconductor device includes: a periodic signal generation circuit configured to generate a periodic signal which comprises information about a change in a refresh period depending on a change in internal temperature; and a flag signal generation circuit configured to extract a flag signal, which comprises the information about the change in the internal temperature, from the periodic signal in response to a mode register read signal, and output the extracted flag signal to an output pad.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
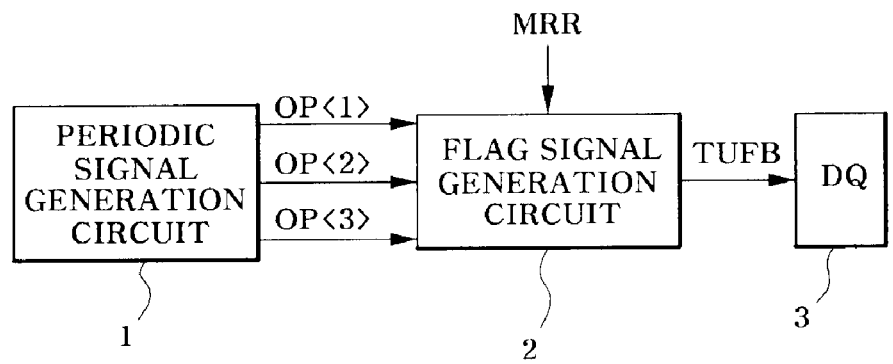
FIG. 1 is a block diagram illustrating the configuration of a semiconductor device including a flag signal generation circuit according to an embodiment of the present invention.

FIG. 1 is a block diagram illustrating the configuration of a semiconductor device including a flag signal generation circuit according to an embodiment of the present invention.

As shown in FIG. 1, a semiconductor device according to an embodiment of the present invention includes, inter alia, a periodic signal generation circuit 1 and a flag signal generation circuit 2. The periodic signal generation circuit 1 is configured to generate first to third periodic signals OP<1:3>, which include the information about the changes in the refresh period due to any changes in the internal temperature of the semiconductor device. The flag signal generation circuit 2 is configured to generate a flag signal TUFB, which includes the information about the changes in the internal temperature, based on the first to third periodic signals OP<1:3> in response to a mode register read signal MRR. The flag signal generation circuit 2 outputs the generated flag signal TUFB to a DQ pad 3.

The periodic signal generation circuit 1 may be implemented with, for example, a temperature-compensated self-refresh (TCSR) circuit. A TCSR circuit generally includes a temperature sensor and the circuits such as a counter, and such a TCSR circuit controls the refresh period adjusting it based on the internal temperature of the semiconductor device. For example, the data retention characteristics of memory cells depend on the internal temperature of the semiconductor device. Therefore, as the internal temperature rises, the self-refresh operations may need to be executed in shorter intervals (that is, more frequently) to prevent data loss. On the other hand, when the internal temperature is low, data could be retained even if the self-refresh operations are performed in longer intervals (i.e., less frequently). In an embodiment of the present invention, the periodic signal generation circuit 1 generates the first to third periodic signals OP<1:3>, and the levels of which are counted and controlled depending on the internal temperature of the semiconductor device. For example, the periodic signal generation circuit 1 down-counts the first to third periodic signals OP<1:3> in order to reduce the refresh period when the internal temperature rises, and up-counts the first to third periodic signals OP<1:3> in order to increase the refresh period when the internal temperature drops. The counting of the first to third periodic signals OP<1:3> can be variously set according to embodiments of the present invention.

Figure 2:
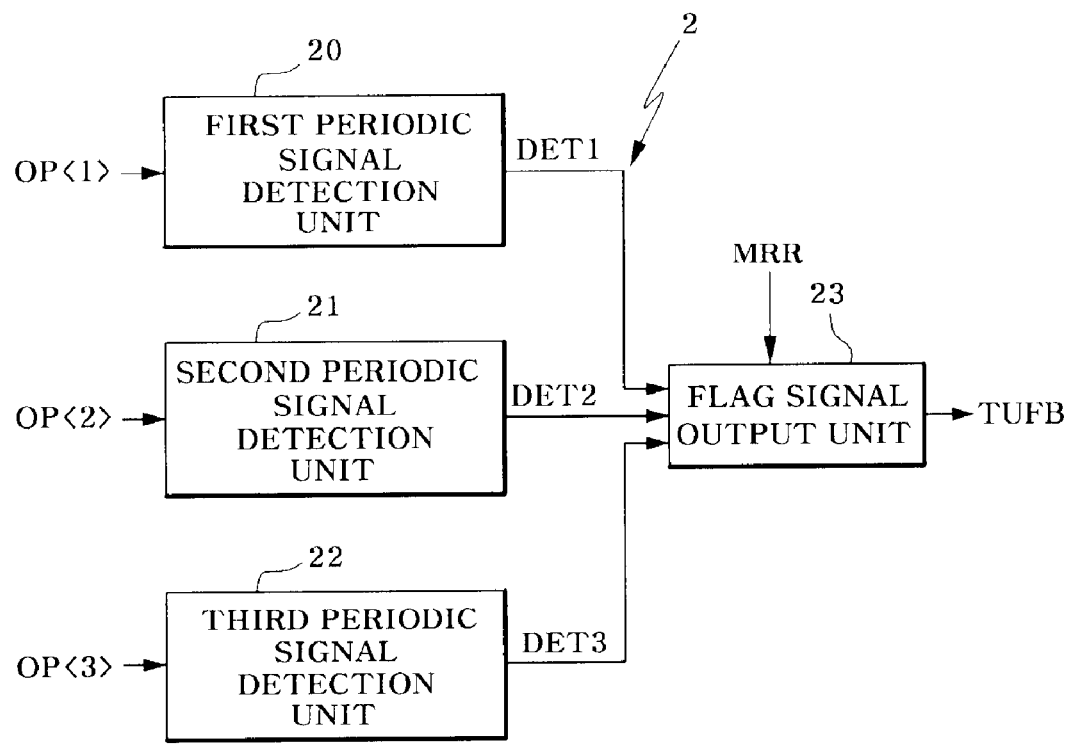
FIG. 2 is a block diagram illustrating the configuration of the flag signal generation circuit included in the semiconductor device of FIG. 1.

As illustrated in FIG. 2, the flag signal generation circuit 2 includes a first periodic signal detection unit 20, a second periodic signal detection unit 21, a third periodic signal detection unit 22, a flag signal output unit 23. The first periodic signal detection unit 20 is configured to generate a first detection signal DET1 which is enabled to a high level when the level of the first periodic signal OP<1> changes. The second periodic signal detection unit 21 is configured to generate a second detection signal DET2 which is enabled to a high level when the level of the second periodic signal OP<2> changes. The third periodic signal detection unit 22 is configured to generate a third detection signal DET3 which is enabled to a high level when the level of the third periodic signal OP<3> changes. The flag signal output unit 23 is configured to generate a flag signal TUFB which is enabled to a low level when at least one of the first detection signal DET1, the second detection signal DET2, and the third detection signal DET3 is enabled to a high level.

Figure 3:
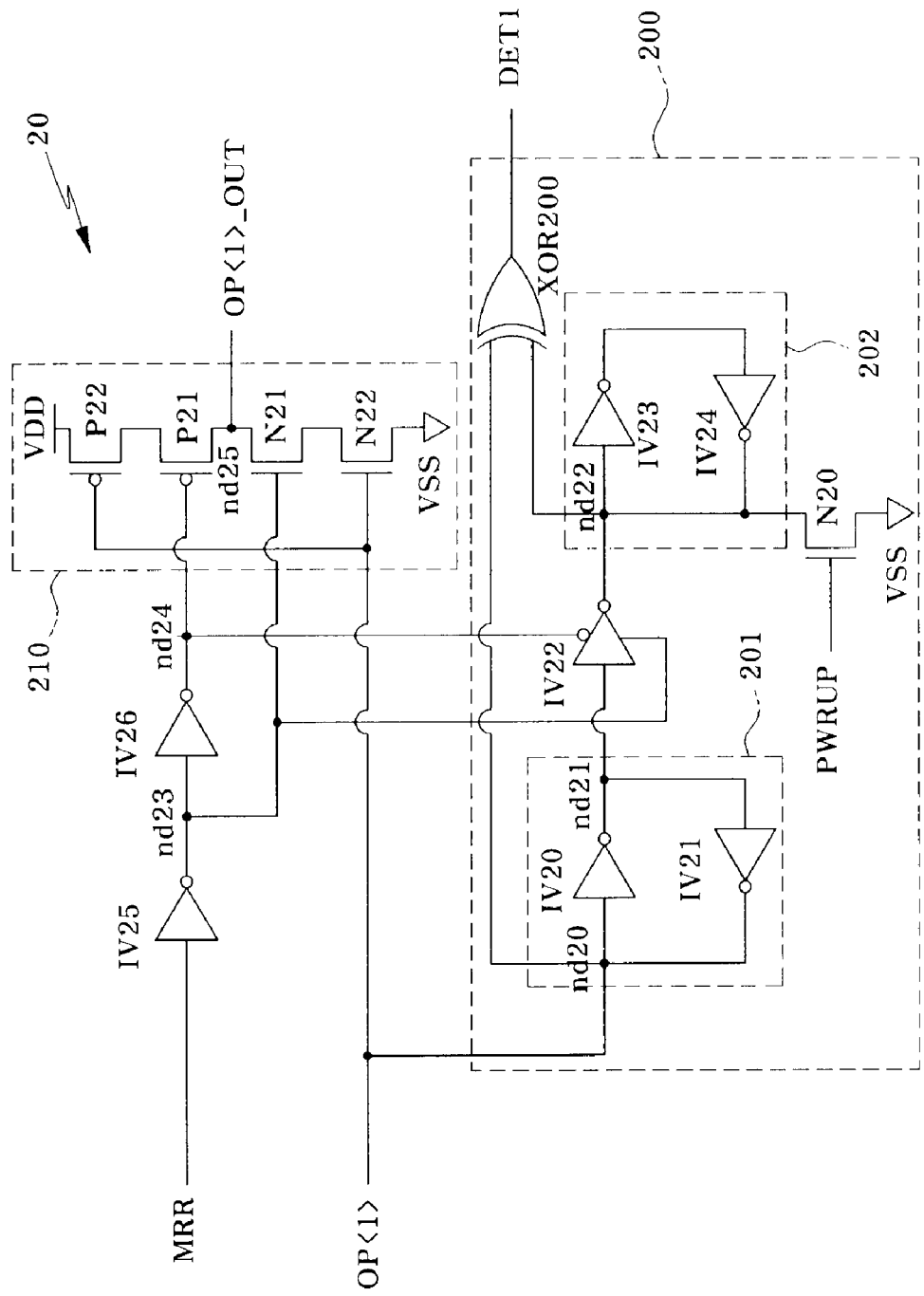
FIG. 3 is a circuit diagram illustrating a first periodic signal detection unit included in the flag signal generation circuit of FIG. 2.

As illustrated in FIG. 3, the first periodic signal detection unit 20 includes a detection signal extraction section 200 and a first buffer section 210. Specifically, the detection signal extraction section 200 includes a first latch 201 configured to latch a signal of a node nd20 to which the first periodic signal OP<1> is inputted, an inverter IV22 configured to buffer a signal of a node nd21 in response to signals of nodes nd23 and nd24, a second latch 202 configured to latch a signal of a node nd22, an NMOS transistor N20 configured to pull down a node nd22 to a ground voltage VSS in response to a power-up signal PWRUP which is enabled in a power-up duration, and an XOR gate XOR200 configured to generate the first detection signal DET1 which is enabled to a high level when the levels of the nodes nd20 and nd22 are different from each other.

The first buffer section 210 includes PMOS transistors P21 and P22 coupled between a power supply voltage (VDD) terminal and a node nd25, and NMOS transistors N21 and N22 coupled between the node nd25 and the ground voltage (VSS) terminal and configured to buffer the first periodic signal OP<1> and output a first output periodic signal OP<1>_OUT in response to a mode register read signal MRR. The mode register read signal MRR is a signal which, when enabled to a low level, causes the output of the first to third periodic signals OP<1:3> or is an operation mode set by an MRS and stored in the registers.

The first periodic signal detection unit 20 configured as above outputs the first detection signal DET1 which is enabled to a high level when a self-refresh period changes due to a change in the internal temperature of the semiconductor device or, in other words, due to a change in the level of the first periodic signal OP<1>. In addition, the first periodic signal detection unit 20 buffers the first periodic signal OP<1> and outputs the first output periodic signal OP<1>_OUT in response to the mode register read signal MRR.

The second periodic signal detection unit 21 and the third periodic signal detection unit 22 would have the same configurations of the first periodic signal detection unit 20 as discussed above, except that the second periodic signal detection unit 21 would receive the second periodic signal OP<2> and output a second output periodic signal OP<2>_OUT and the second detection signal DET2. Similarly, the third periodic signal detection unit 22 would receive the third periodic signal OP<3> and output a third output periodic signal OP<3>_OUT and the third detection signal DET3. Accordingly, the detailed descriptions of the configuration and operation of the second periodic signal detection unit 21 and the third periodic signal detection unit 22 are not repeated herein as the repeated discussions are not considered as necessary to understand.

Figure 4:
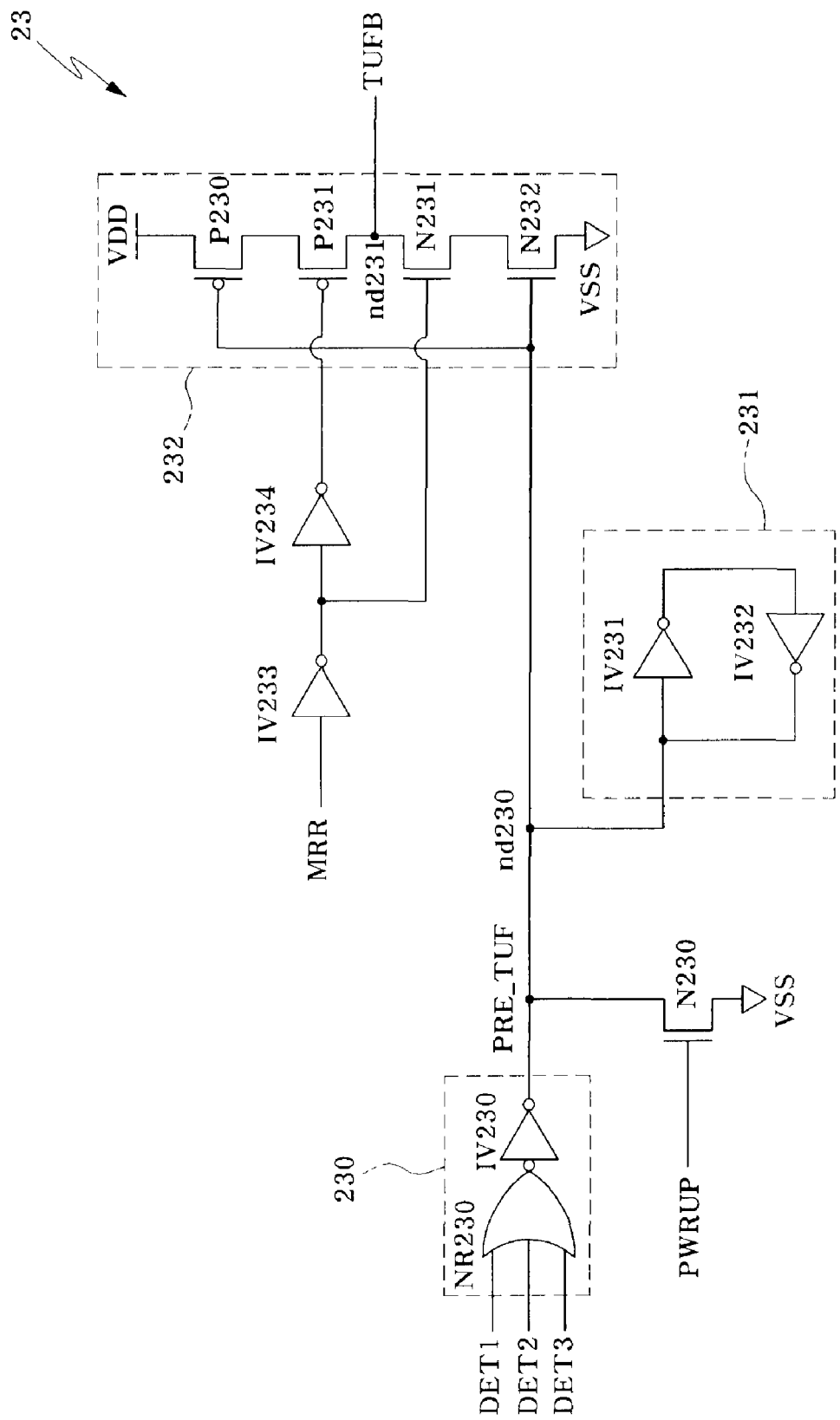
FIG. 4 is a circuit diagram illustrating a flag signal output unit included in the flag signal generation circuit of FIG. 2.

As illustrated in FIG. 4, the flag signal output unit 23 includes a logic section 230, an NMOS transistor N230, a third latch section 231, and a second buffer section 232. Specifically, the logic section 230 is configured to perform an OR operation on the first to third detection signals DET1, DET2, DET3 and generate a pre-flag signal PRE_TUF. The NMOS transistor N230 is configured to pull down a node nd230 to a ground voltage VSS in response to the power-up signal PWRUP. The third latch section 231 is configured to latch a signal of the node 230. The second buffer section 232 is configured to buffer the pre-flag signal PRE_TUF and output the buffered pre-flag signal PRE_TUF as the flag signal TUFB when the mode register read signal MRR is enabled to a low level. The second buffer section 232 includes PMOS transistors P230 and P231 coupled between the power supply voltage (VDD) terminal and a node nd231, and NMOS transistors N231 and N232 coupled between the node nd231 and the ground voltage (VSS) terminal.

The flag signal output unit 23 configured as above buffers the pre-flag signal PRE_TUF, which is enabled to a high level when at least one of the first to third detection signals DET1, DET2, DET3 is enabled to a high level, in response to the mode register read signal MRR, and generates the flag signal TUFB which is enabled to a low level.

Hereinafter, the operations of the semiconductor device configured as above will be described with reference to FIGS. 1 to 4.

First, when the internal temperature of the semiconductor device changes, the level of at least one of the first to third periodic signals OP<1:3> generated by the periodic signal generation circuit 1 also changes.

Next, when the level of at least one of the first to third periodic signals OP<1:3> changes, the flag signal generation circuit 2 generates the flag signal TUFB which is enabled to a low level. More specifically, the following description will be made about the case in which the level of the first periodic signal OP<1> among the first to third periodic signals OP<1: 3> changes depending on a change in the internal temperature of the semiconductor device.

When the level of the first periodic signal OP<1> changes, the levels of the nodes nd20 and nd22 which are detected by the first periodic signal detection unit 20 of FIG. 3 are different from each other. Thus, the first detection signal DET1 outputted from the XOR gate XOR200 is enabled to a high level. When the first detection signal DET1 is enabled to a high level, the logic section 230 of the flag signal output unit 23 illustrated in FIG. 4 generates the pre-flag signal PRE_TUE which is enabled to a high level. Accordingly, in a duration in which the mode register read signal MRR having a low level is inputted, the second buffer section 234 buffers the pre-flag signal PRE_TUE and generates the flag signal TUFB which is enabled to a low level. In this case, the inverter IV22 driven by the mode register read signal MRR having the low level causes the nodes nd20 and nd22 to have a substantially equal level.

As described above, the semiconductor device according to an embodiment of the present invention extracts the flag signal including information about a change in the internal temperature from a change in the levels of the first to third periodic signals OP<1:3> related to the information about a change in the refresh period due to changes in the internal temperature of the semiconductor device.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A flag signal generation circuit in a semiconductor device comprising:
   a first periodic signal detection unit configured to detect a change in a level of a first periodic signal and generate a first detection signal indicative of a internal temperature change in the semiconductor device;
   a second periodic signal detection unit configured to detect a change in a level of a second periodic signal and generate a second detection signal also indicative of an internal temperature change in the semiconductor device; and
   a flag signal output unit configured to generate a pre-flag signal based on the first and second detection signals, buffer the pre-flag signal in response to a mode register read signal, and output the buffered pre-flag signal as a flag signal.

2. The flag signal generation circuit of claim 1, wherein each of the first and second periodic signals comprises information about a change in the refresh period due to a change in the internal temperature of a semiconductor device.

3. The flag signal generation circuit of claim 2, wherein the first and second periodic signals are generated by a temperature-compensated self-refresh (TCSR) circuit comprising a temperature sensor circuit and a counter.

4. The flag signal generation circuit of claim 1, wherein the flag signal comprises information about a change in internal temperature of a semiconductor device.

5. The flag signal generation circuit of claim 1, wherein the first periodic signal detection unit is configured to generate the first detection signal which is enabled when the level of the first periodic signal changes.

6. The flag signal generation circuit of claim 1, wherein the first periodic signal detection unit comprises:
   a first latch section configured to latch the first periodic signal;
   a buffer section configured to buffer an output signal of the first latch section in response to the mode register read signal; and
   a logic section configured to compare the first periodic signal with an output signal of the buffer section, and generate the first detection signal.

7. The flag signal generation circuit of claim 6, wherein the first periodic signal detection unit further comprises:
   a second latch section configured to latch the output signal of the buffer section; and
   a buffer section configured to buffer and output the first periodic signal in response to the mode register read signal.

8. The flag signal generation circuit of claim 1, wherein the second periodic signal detection unit is configured to generate the second detection signal which is enabled when the level of second periodic signal changes.

9. The flag signal generation circuit of claim 1, wherein the second periodic signal detection unit comprises:
   a first latch section configured to latch the second periodic signal;
   a first buffer section configured to buffer an output signal of the first latch unit in response to the mode register read signal; and
   a logic section configured to compare the second periodic signal with an output signal of the buffer section, and generate the second detection signal.

10. The flag signal generation circuit of claim 9, wherein the second periodic signal detection unit further comprises:
    a second latch section configured to latch the output signal of the first buffer section; and
    a second buffer section configured to buffer and output the second periodic signal in response to the mode register read signal.

11. The flag signal generation circuit of claim 1, wherein the flag signal output unit comprises:
    a logic section configured to receive the first and second detection signals and generate the pre-flag signal; and
    a buffer section configured to buffer the pre-flag signal and output the buffered pre-flag signal as the flag signal in response to the mode register read signal.

12. The flag signal generation circuit of claim 11, wherein the logic section is configured to generate the pre-flag signal which is enabled when at least one of the first and second detection signals is enabled.

13. The flag signal generation circuit of claim 11, wherein the flag signal output unit further comprises:
    a reset section configured to reset an output node of the logic section in response to a power-up signal; and
    a latch section configured to latch a signal of the output node of the logic section.

14. A semiconductor device, comprising:
    a periodic signal generation circuit configured to generate first and second periodic signal which comprise information about a change in a refresh period depending on a change in internal temperature of the semiconductor device; and
    a flag signal generation circuit configured to generate a pre-flag signal which is enabled when at least one of a level of the first periodic signal and a level of the second periodic signal changes, buffer the pre-flag signal in response to a mode register read signal, and output the buffered pre-flag signal as a flag signal comprising the information about the change in the internal temperature.

15. The semiconductor device of claim 14, wherein the periodic signal generation circuit comprises a temperature-compensated self-refresh (TCSR) which is configured to control the refresh period in response to the change in the internal temperature.

16. The semiconductor device of claim 14, wherein the flag signal generation circuit comprises:
    a first periodic signal detection unit configured to detect a change in a level of the first periodic signal and generate a first detection signal;
    a second periodic signal detection unit configured to detect a change in a level of the second periodic signal and generate a second detection signal; and
    a flag signal output unit configured to generate a pre-flag signal based on the first and second detection signals, buffer the pre-flag signal in response to the mode register read signal, and output the buffered pre-flag signal as the flag signal.

17. The semiconductor device of claim 16, wherein the first periodic signal detection unit is configured to generate the first detection signal which is enabled when the level of the first periodic signal changes.

18. The semiconductor device of claim 16, wherein the first periodic signal detection unit comprises:
   a first latch section configured to latch the first periodic signal;
   a buffer section configured to buffer an output signal of the first latch unit in response to the mode register read signal; and
   a logic section configured to compare the first periodic signal with an output signal of the buffer and generate the first detection signal.

19. The semiconductor device of claim 18, wherein the first periodic signal detection unit further comprises:
   a second latch section configured to latch the output signal of the buffer; and
   a buffer section configured to buffer and output the first periodic signal in response to the mode register read signal.

20. The semiconductor device of claim 16, wherein the second periodic signal detection unit is configured to generate the second detection signal which is enabled when the level of second periodic signal changes.

21. The semiconductor device of claim 16, wherein the second periodic signal detection unit comprises:
   a first latch section configured to latch the second periodic signal;
   a first buffer section configured to buffer an output signal of the first latch unit in response to the mode register read signal; and
   a logic section configured to compare the second periodic signal with an output signal of the buffer and generate the second detection signal.

22. The semiconductor device of claim 21, wherein the second periodic signal detection unit further comprises:
   a second latch section configured to latch the output signal of the first buffer section; and
   a second buffer section configured to buffer and output the second periodic signal in response to the mode register read signal.

23. The semiconductor device of claim 16, wherein the flag signal output unit comprises:
   a logic section configured to receive the first and second detection signals and generate the pre-flag signal; and
   a buffer section configured to buffer the pre-flag signal and output the buffered flag signal in response to the mode register read signal, wherein the buffered flag signal is outputted as the flag signal to an output pad.

24. The semiconductor device of claim 23, wherein the logic section is configured to generate the pre-flag signal which is enabled when at least one of the first and second detection signals is enabled.

25. The semiconductor device of claim 23, wherein the flag signal output unit further comprises:
   a reset section configured to reset an output node of the logic section in response to a power-up signal; and
   a latch section configured to latch a signal of the output node of the logic section.

* * * * *